(12) United States Patent
Steckner et al.

(10) Patent No.: US 8,729,899 B2
(45) Date of Patent: May 20, 2014

(54) MRI MAGNET AND MRI SYSTEM WITH OPTIMIZED FRINGE FIELDS, ATTRACTIVE FORCES AND SPATIAL CONSTRAINTS

(75) Inventors: Michael Steckner, Beachwood, OH (US); Bruce C. Breneman, Rancho Santa Fe, CA (US)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 216 days.

(21) Appl. No.: 13/178,805

(22) Filed: Jul. 8, 2011

(65) Prior Publication Data

US 2013/0009642 A1    Jan. 10, 2013

(51) Int. Cl.
*G01V 3/00*    (2006.01)
(52) U.S. Cl.
USPC ............................ 324/319; 324/320; 335/216
(58) Field of Classification Search
USPC .......... 324/319, 320, 318; 335/216, 299, 301
See application file for complete search history.

(56) References Cited

U.S. PATENT DOCUMENTS

| | | | | |
|---|---|---|---|---|
| 4,587,504 A | * | 5/1986 | Brown et al. | 335/216 |
| 4,724,412 A | * | 2/1988 | Kalafala | 335/299 |
| 5,012,217 A | * | 4/1991 | Palkovich et al. | 335/301 |

FOREIGN PATENT DOCUMENTS

JP    2007-289670    11/2007

* cited by examiner

*Primary Examiner* — Louis Arana
(74) *Attorney, Agent, or Firm* — Nixon & Vanderhye PC (57) ABSTRACT

A magnetic resonance imaging (MRI) system magnet includes at least one main electromagnet winding disposed within a first radius of the magnet and at least one bucking electromagnet winding disposed within a second radius, larger than the first radius of the magnet and configured to provide self-shielding magnetic fields that substantially reduce fringe magnetic fields outside the magnet produced by the main electromagnet winding. The combination of magnetic fields produced by both the main and bucking electromagnet windings inside the magnet conform to MRI requirements within at least an imaging volume. The main and bucking electro-magnet windings are configured so as to create a net fringe field outside the magnet within the range of 50-100 gauss at a distance within a range of 3-5 meters axially and 2-3 meters radially from a center of the magnet.

16 Claims, 9 Drawing Sheets

MRI SYSTEM STATIC $B_m$ MAGNET

MRI MAGNET AND MRI SYSTEM WITH OPTIMIZED FRINGE FIELDS, ATTRACTIVE FORCES AND SPATIAL CONSTRAINTS

FIELD

The subject matter below relates generally to magnetic resonance imaging (MRI) systems and processes. In particular, this application describes an improved MRI system incorporating a static $B_0$ magnet having more optimized $B_m$ fringe field constraints including spatially defined limits and/or attractive forces/torques limits.

DETAILED DESCRIPTION

Figure 1:
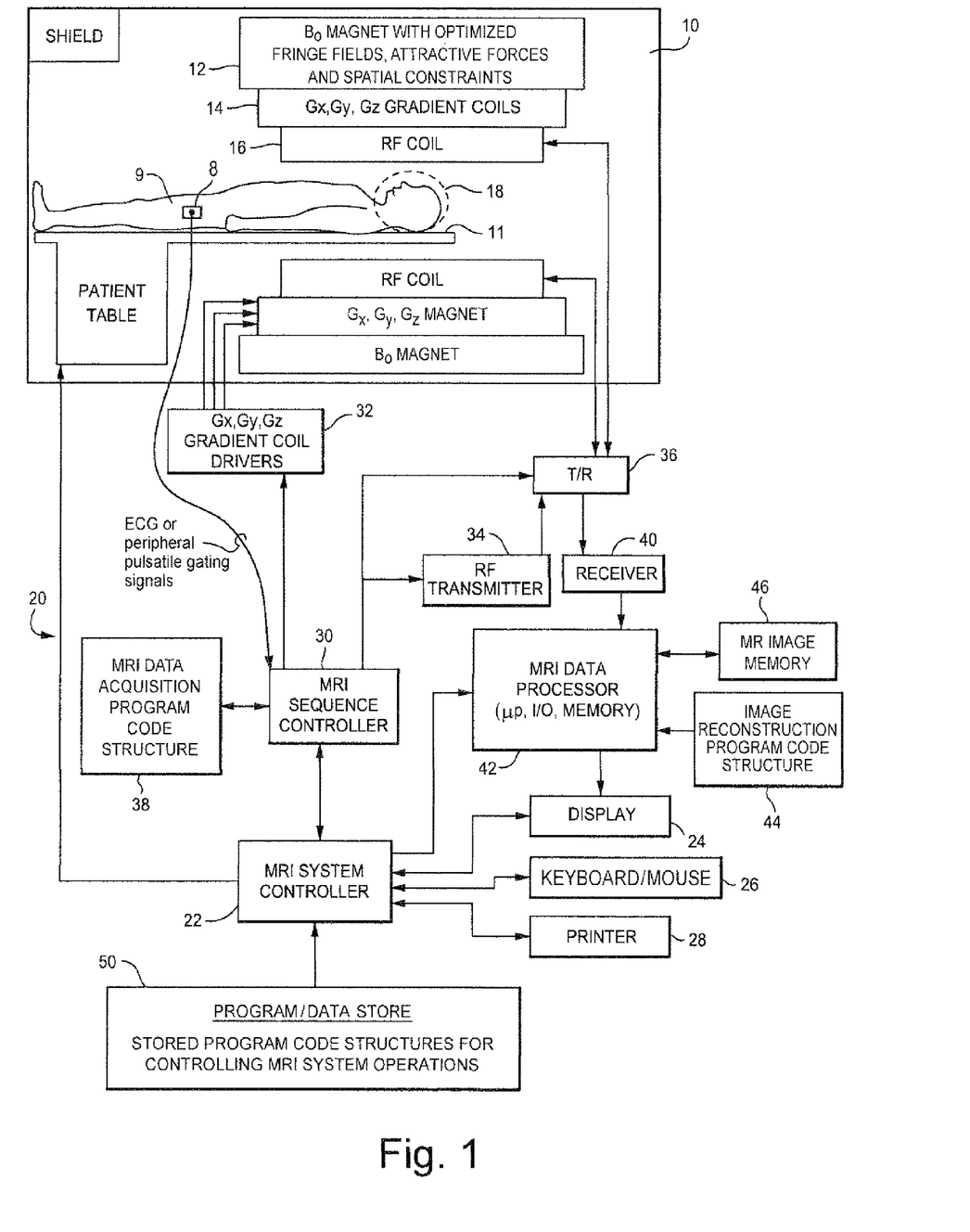
FIG. 1 is a high-level schematic block diagram of an exemplary MRI system embodiment incorporating an improved exemplary static $B_0$ magnet.

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field 60 magnet 12, a $G_x$, $G_y$ and $G_z$ gradient coil set 14 and an RF coil assembly 16. Along the horizontal axis of this cylindrical array of elements is an imaging volume 18 shown as substantially encompassing the head of a patient 9 supported by a patient bed or table 11.

An MRI system controller 22 has input/output ports connected to display 24, keyboard/mouse 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$ and $G_z$ gradient coil drivers 32, as well as the RF transmitter 34 and the transmit/receive switch 36 (if the same RF coil 16 is used for both transmission and reception). Of course, RF coils for coil arrays adapted to closely parallel various patient body surfaces are often used instead of or in conjunction with the whole body coil 16 depicted in FIG. 1. As those in the art will appreciate, one or more suitable body electrodes 8 may be affixed to the patient's body to provide ECG (electrocardiogram) and/or peripheral pulsatile gating signals to the MRI sequence controller 30. The MRI sequence controller 30 also has access to suitable program code structure 38 for implementing MRI data acquisition sequences already available in the repertoire of the MRI sequence controller 30 images using operator and/or system inputs defining particular MRI data acquisition sequence parameters.

The MRI system 20 includes an RF receiver 40 providing input to data processor 42 so as to create processed image data to display 24. The MRI data processor 42 is also configured for access to image reconstruction program code structure 44 and to MR (magnetic resonance) image memory 46 (e.g., for storing MR image data derived from processing in accordance with the exemplary embodiments and the image reconstruction program code structure 44).

Also illustrated in FIG. 1 is a generalized depiction of an MRI system program/data store 50 where stored program code structures for controlling MRI system operations are stored in computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast AID conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an MR-imaging reconstruction process, an array of computer-readable accessible data value storage sites (e.g., multi-digit binary representations of pixel values) in physical storage media will be transformed from some prior state (e.g., all uniform "zero" values or all "one" values) to a new state wherein the physical states at the physical sites of such an array (e.g., of pixel values) vary between minimum and maximum values to represent real world physical events and conditions (e.g., the tissues of a patient over an imaged volume space). As those in the art will appreciate, such arrays of stored data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

As noted, an MRI system typically includes a gantry and various related system components interfaced therewith. At least the gantry is typically located in a shielded room. One MRI system geometry includes a substantially coaxial cylindrical arrangement of the static field B magnet, a $G_x$, $G_y$ and $G_z$ gradient coil set and an RF coil assembly. Along the horizontal axis of this cylindrical array of elements is an imaging volume substantially encompassing the anatomy to be imaged of a patient supported by a patient table.

Figure 2:
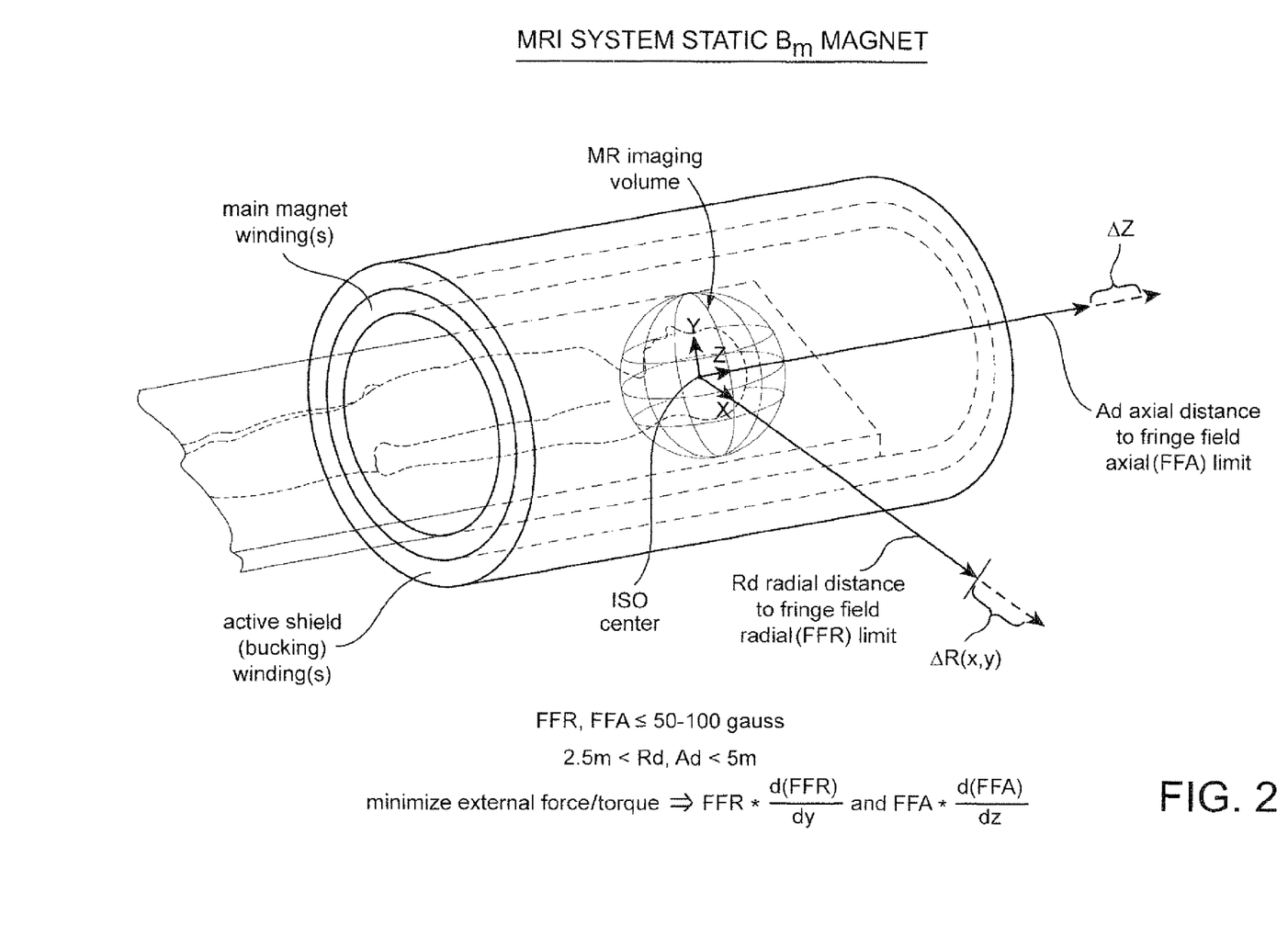
FIG. 2 is a high-level schematic block diagram of an exemplary MRI system static $B_0$ magnet for the exemplary MRI system of FIG. 1.

FIG. 2 depicts an exemplary MRI system static $B_0$ magnet embodiment of cylindrical configuration. As those in the art will appreciate, this is only one possible configuration for an MRI system static magnet used for producing the required static $B_0$ field that is hopefully substantially homogeneous within an MR imaging volume (typically associated with the iso-center of the magnet structure). In this exemplary cylindrical embodiment, cryogenically cooled electromagnet windings are utilized—as is typically the case. As those in the art will appreciate, the actual windings are not shown in FIG. 2. Instead, only schematic cylindrical modules are shown, the actual windings being located therewithin. As depicted, the main magnet windings are typically located radially inwardly of active shield ("bucking") windings that are employed in an effort to reduce unwanted $B_m$ fringe fields that necessarily exist external to the static magnet structure. As those in the art will appreciate, the usual x, y, z gradient coil set, RF coil(s), signal sources, drivers and control system are not shown in FIG. 2.

As depicted in FIG. 2, the static magnet system is typically designed to have (partial or full) active shielding to limit $B_m$ fringe fields in the axial $A_d$ and radial $R_d$ dimensions to respectively associated $B_m$ fringe field limits FFA (in the axial dimension) and FFR (in the radial dimension).

In an exemplary embodiment, the maximum $B_m$ fringe field limits are somewhat relaxed so as to permit acceptable fringe field distances $A_d$ and $R_d$ to be extended (e.g., by $\Delta Z$ and $\Delta Y$, respectively). For example, in an exemplary embodiment, the radial and axial fringe field limits are relaxed to approximately 50-100 gauss at the usual $R_d$ and/or $A_d$ distances of 3 and 5 meters, respectively. As will be appreciated, this means that the more typical 5 gauss limit locations have been extended out considerably by $\Delta Z$ and $\Delta Y$ amounts.

Nevertheless, the increased fringe field strength (magnitude) at closer positions to the magnet can be accommodated by optimizing the main magnet windings and/or active shield (bucking) windings so as to minimize external forces and/or torque exerted on ferro-magnetic materials in the vicinity of the magnet structure. As depicted in FIG. 2, such external forces/torque are proportional to the product of the fringe field magnitude and its rate of change with respect to distance.

Figure 3A:
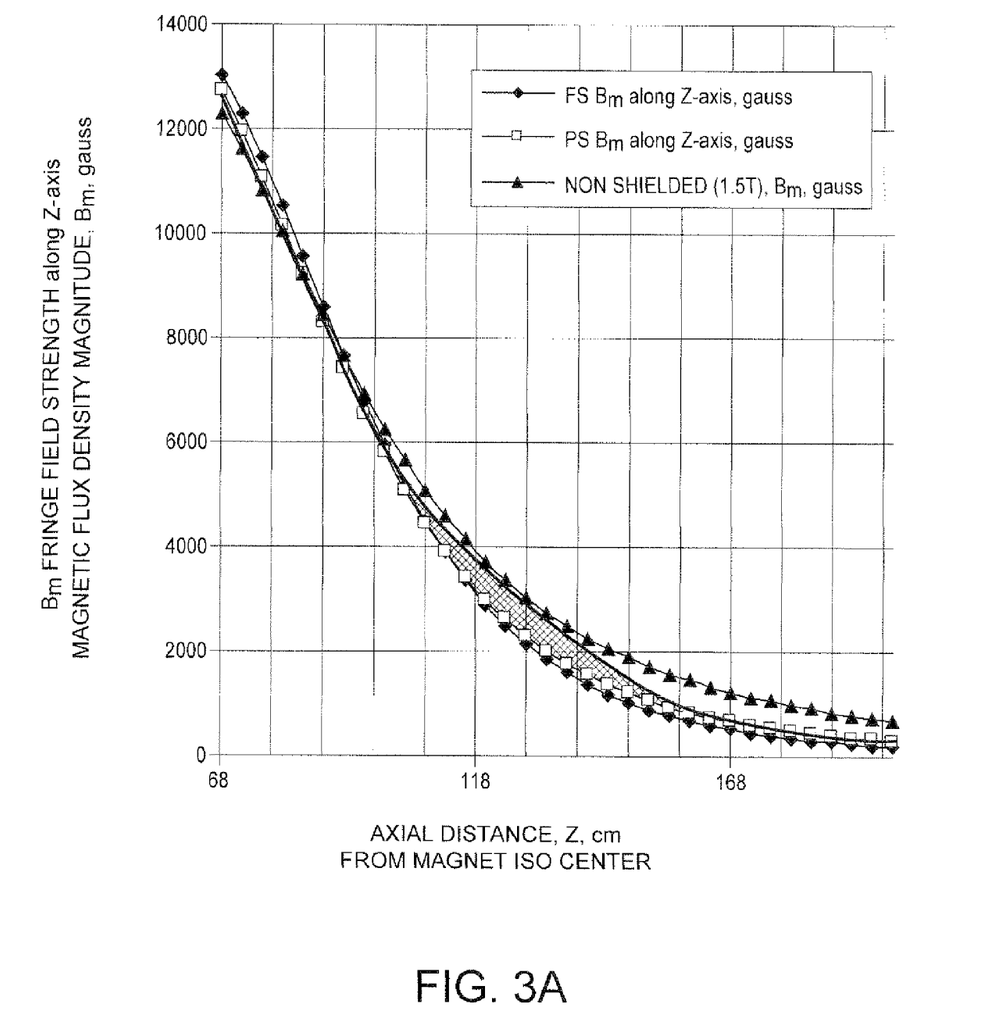
FIGS. 3A-3C are graphs respectively depicting static $B_m$ field strength, gradient and torque parameters along the z-axis with cross-hatched areas for exemplary embodiments of an improved MRI system magnet.
Figure 3B:
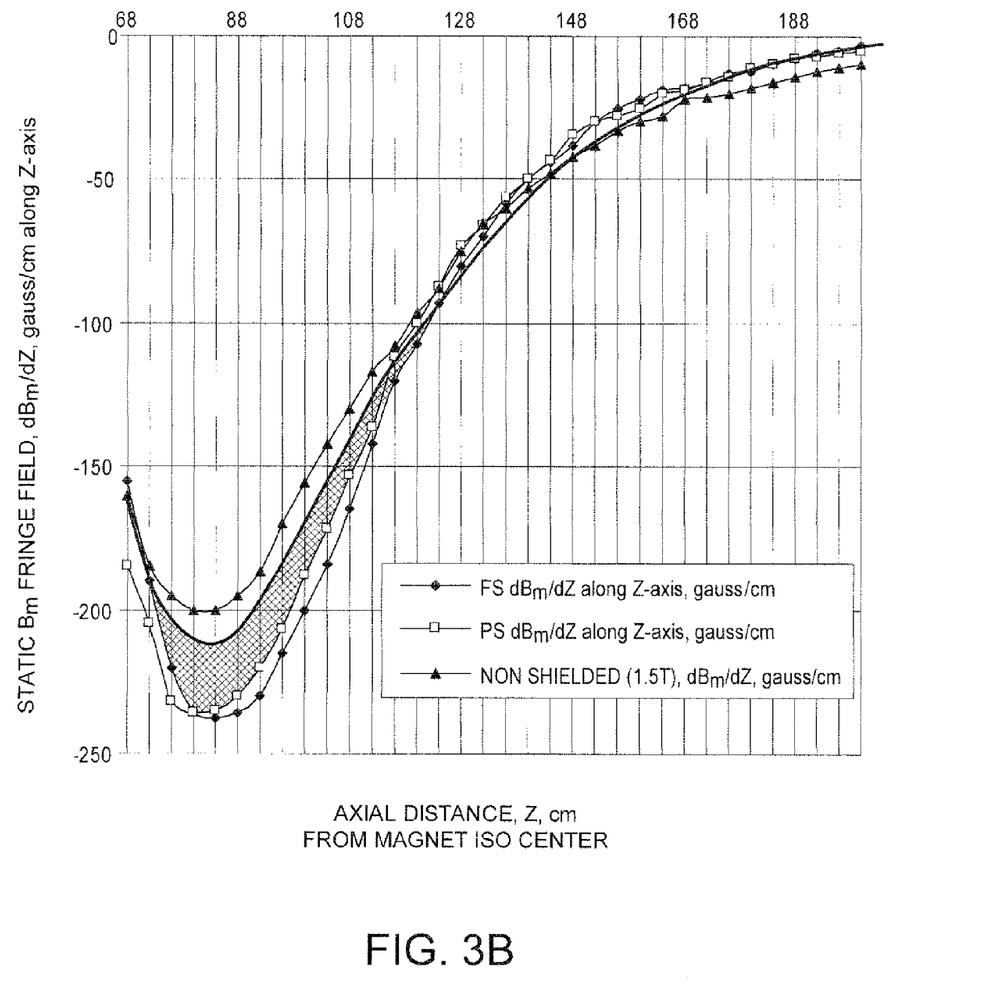
Figure 3C:
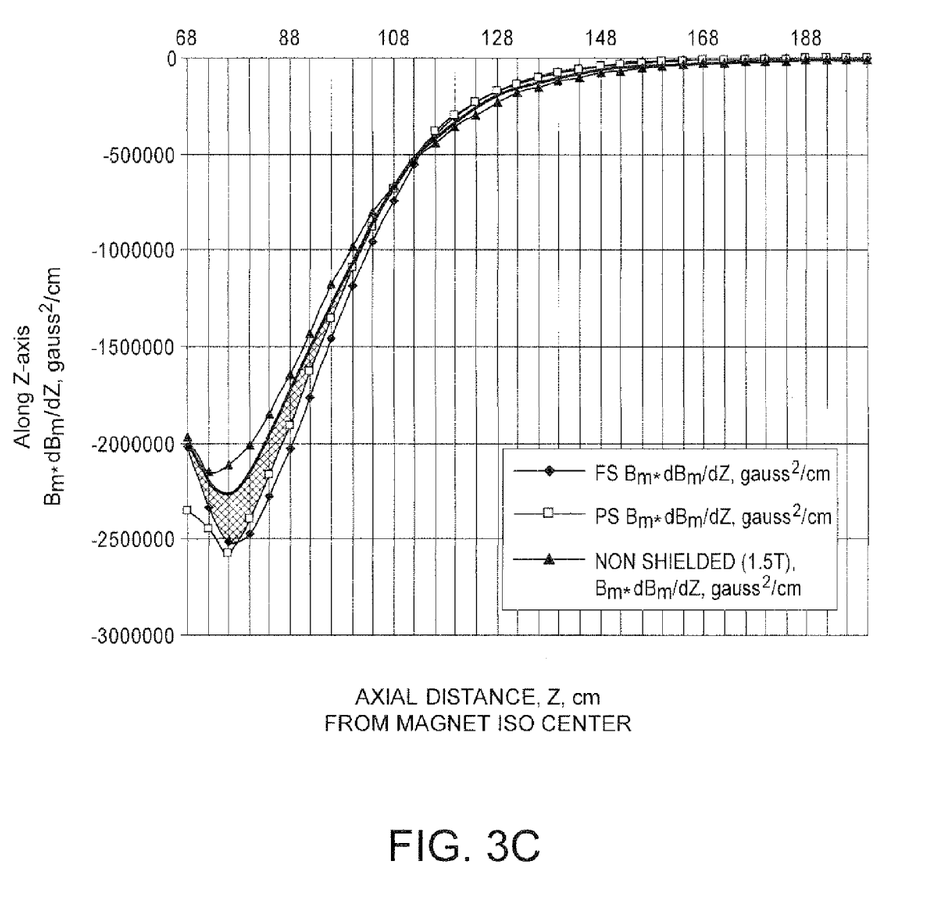

FIGS. 3A-3C are graphs respectively showing $B_m$ magnetic flux density magnitude, gradient magnitude and resulting torque forces along the z-axis as a function of axial distance z from the magnet iso-center for typical prior fully shielded (FS) $B_m$ fields, partially shielded (PS) $B_m$ fields and for a non-shielded example—all at 1.5 Tesla (T). Superimposed on these graphs is a solid line depicting an exemplary embodiment and an associated cross-hatched area representing a range of exemplary embodiments.

Figure 4A:
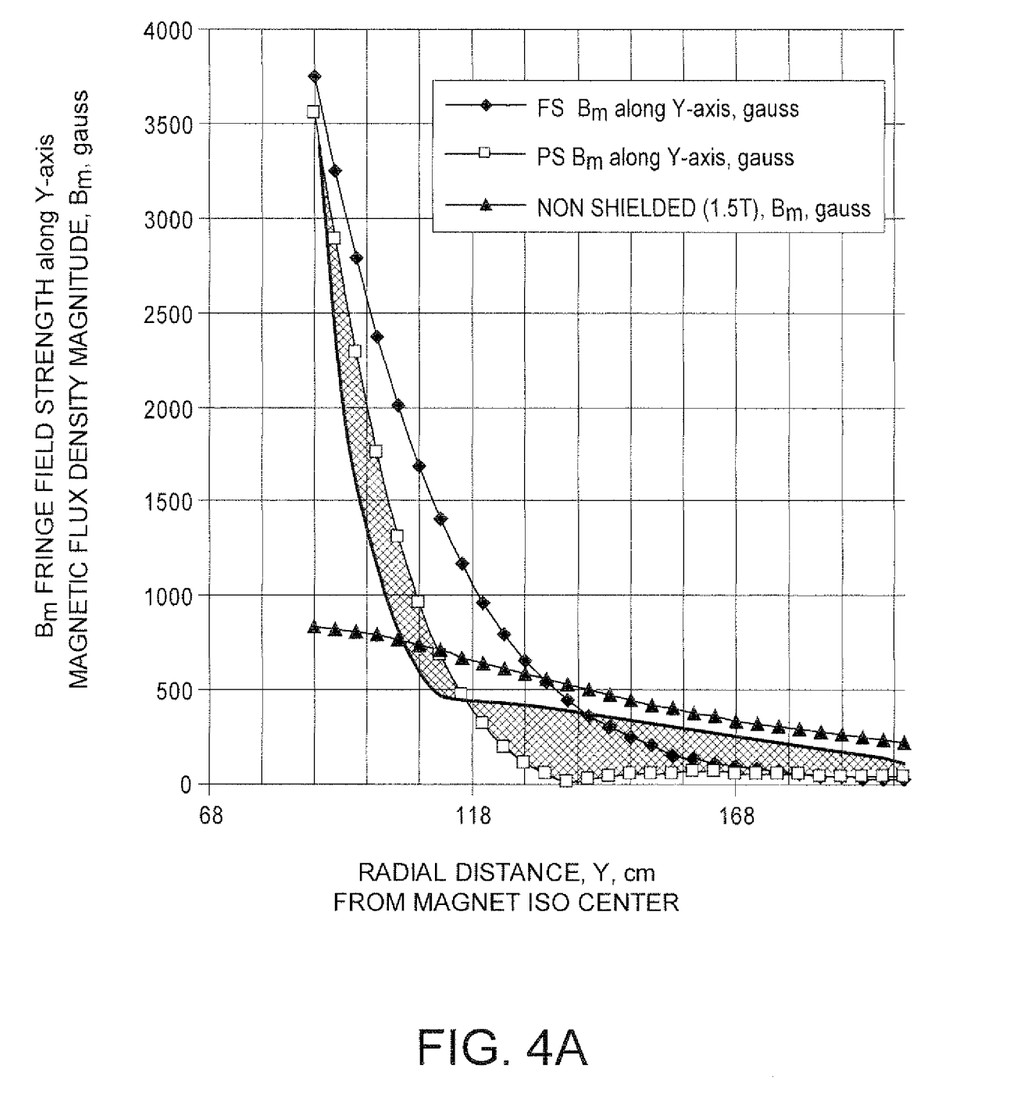
FIGS. 4A-4C are graphs respectively depicting the same exemplary static $B_m$ field strength, gradient and torque parameters along a radial y-axis dimension with cross-hatched areas also representative of exemplary embodiments of an improved magnetic resonance imaging system magnet.
Figure 4B:
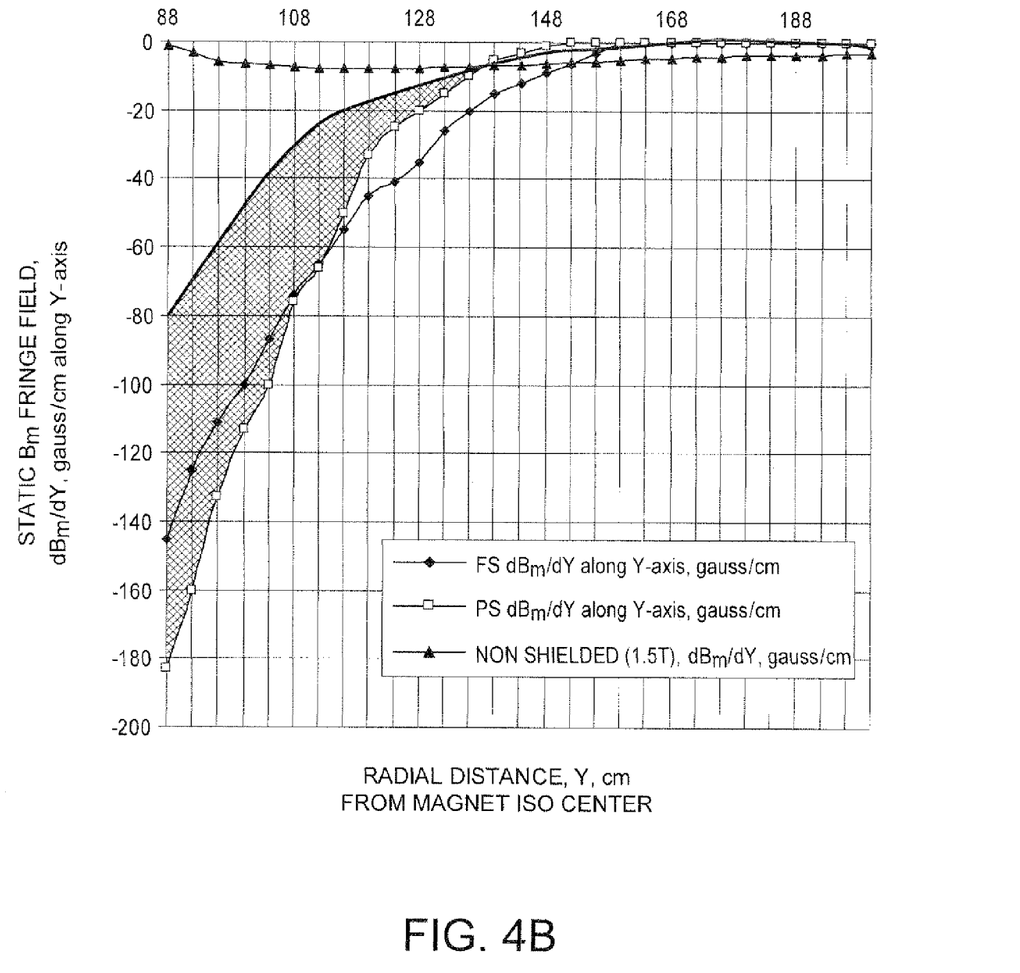
Figure 4C:
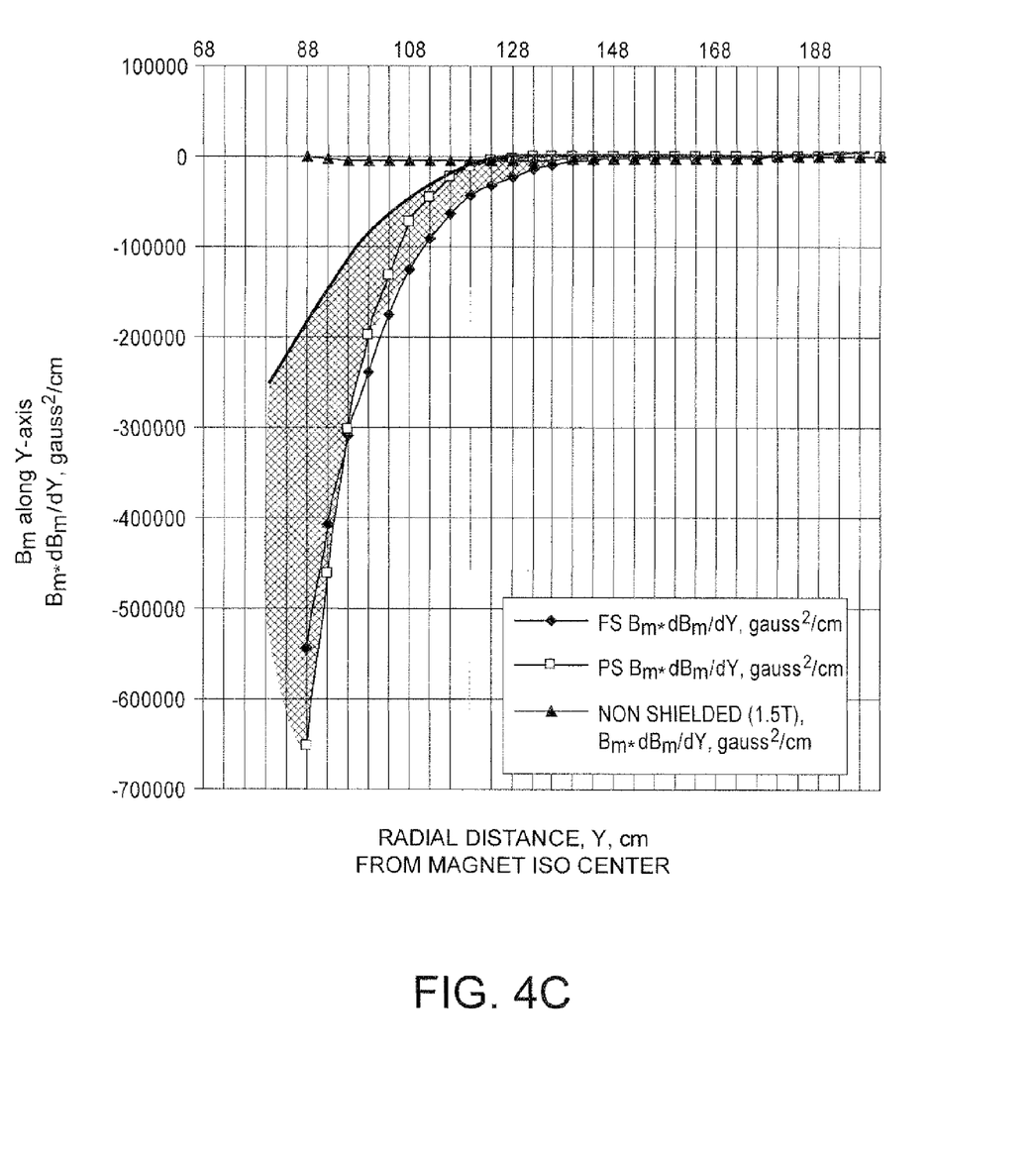

Similarly, FIGS. 4A-4C depict the same situation with respect to the orthogonal radial (x,y) axis dimension of the exemplary embodiments.

Current MRI magnet technology uses a self-shielded design to minimize the volume required to enclose the typical 5 gauss design specification line while simultaneously optimizing magnetic field homogeneity in the target imaging region. The external 5 gauss line represents a typical threshold below which current cardiac pacemakers, etc., will properly operate, and above which they may not operate correctly. If the space requirements could be minimized, MRI system space requirements could be reduced (e.g., providing lower cost).

Prior to currently employed self-shielded magnets (referred to herein as fully shielded "FS" magnets), there were unshielded magnets that were optimized solely for magnetic field homogeneity within the target imaging region or passively shielded magnets that controlled external fields at the expense of both weight and cost.

The translational attractive force exerted by a magnetic field on a ferrous object is a function of the gradient of change in the magnetic field energy density that itself is a function of the magnetic flux density and magnetic field intensity (sometimes referred to as magnetic field density).

The rotational attractive force (torque) is a function of the magnetic field intensity (magnetic field density) at the location of the ferrous object.

Current self-shielded (FS) magnets have high magnetic fields and spatial gradients in the space surrounding the magnet and can produce very strong attractive forces and torques that vary rapidly with location. The strong attractive forces/torques can easily pull ferrous objects from someone's grasp (e.g., an oxygen cylinder or tools), and there is little warning that one is approaching the maximal attractive force location because the attractive force v. location is considerably non-linear.

Older non-shielded magnets have lower external spatial gradient and magnetic fields near the magnet as there was no design effort to minimize the 5 gauss field area. In comparison with a self-shielded (FS) magnet, the attractive forces/torques are lower with the corresponding magnetic field and spatial change in field being reduced, providing more attractive force warning and improved safety.

In the future, we may find that all active implants (e.g., pacemakers, etc.) can operate within the magnetic field of an MRI magnet. This could potentially eliminate the need for placing the 5 gauss region within a controlled space. However, it is still critically important for safety purposes to control the space around a magnet because the next major safety concern is ferrous object attractive forces/torques. It is also functionally necessary to control the space around a magnet to a level consistent with the operation of other equipment. One typical value associated with normal functioning of equipment is 50 gauss (e.g., computer systems). If these individual devices are specially and cheaply shielded, it may be possible to further relax the requirements to 100 gauss or more.

In light of these developments, magnet design algorithms and requirements are now reconsidered. This permits the magnet room walls to be at a significantly higher gauss level (for example, 100 gauss) and the magnet can be designed to minimize attractive forces and/or torques by any optimized passive and active mechanism or technique. Magnet design optimizations may also consider configuration of the optimal imaging volume produced by the magnet combined with attractive force requirements and/or 100 gauss (for example) spatial limit requirements. Optimizations can secondarily consider cost of magnet design, reduced site wall shielding costs, partial active and/or passive shielding costs, cost of floor space both in the imaging suite and surrounding area, etc.

It is also possible that walls around the magnet might not be necessary if the surrounding space is appropriately secured by other means, potentially hazardous and necessary equipment are properly secured and other methods are used to provide necessary RF shielding to the receivers (coils) and subject during the MRI process.

The exemplary embodiments described herein provide a concept and methodology leading to a new generation of MRI magnets. These magnets operate with external field constraints established by implantable device field limitations and/or magnetic attractive forces. The resulting reduced external field limitation also allows for a synergistic magnet and site shielding configuration. The overall benefits would be reduced magnet construction complexity and cost, re-optimized ferro-magnetic site shielding, and inherently reduced magnetic forces and torques near the magnet, thus improving overall operational safety.

New design methodologies are proposed that should lead to a much lower overall MRI magnet cost including re-optimized on-site ferro-magnetic shielding. Operational safety would be improved as localized fields and field gradients are minimized in close proximity to the magnet itself, thus reducing the magnet's inherent attractive forces and torques on ferro-magnetic objects.

For MRI magnets of field strength 1.0T and above, shielding of the magnet's inherently large external fields is required. Passive shielding of the magnet directly is undesirable as the required shielding can be in excess of 10 tonnes. Active shielding has become the industry standard approach for magnet self-shielding. Additionally, the FDA has made the recommendation that the general public not be exposed to DC magnetic fields in excess of 5 g due to exposure limits of active implanted medical devices (AND).

A typical non-shielded 1.5 T magnet's radial and axial 5 g line may be located at 7.5 m radially×10.0 m axially, respectively, from magnet center (iso-center), whereas an actively shielded 1.5T magnet will have radial and axial 5 g lines located at 2.5 m-3.0 m radially×4.0 m-5.0 m axially from iso-center, respectively. The cost and magnet complexity associated with active self-shielding is substantial. A typical self-shielded magnet will require 2-3 times more ampere-turns in the coil design (e.g., including oppositely poled bucking or shielding coils at a larger radius than the main $B_0$ magnet coil windings).

Hybrid shielded magnets (combination of active and passive shielding) have also been used, but also offer a poor solution due to both weight and cost issues.

When MR-compatible AIMDs become the norm, it will no longer be necessary to restrict to the 5 g line. For example, the electronics associated with an MR scanner can operate up to approximately 100 g. Other common electronic devices are also capable of operating at approximately the same magnetic field exposures. However, once the safety ramifications of AIMDs are eliminated, the next significant hazard of an MR magnet are the attractive forces and torques on ferro-magnetic objects, a safety concern for passive implanted objects and for items inadvertently brought into the magnet room. These attractive forces/torques are a function of the magnetic field strength at a given location and/or the spatial gradient (rate of change) of the magnetic field strength at the same location, Existing active self-shielded magnet methodologies that constrain the 5 g (or any other level) volume requirements increase the spatial rate of change of the main magnetic field and can cause magnetic field increases, both increasing the attractive forces and torques acting on the object.

By adopting a synergistic concept of reduced or eliminated active shielding coupled with minimal radial and/or axial site (room) shielding, to contain not the 5 g level, but instead the magnet's AIMD acceptable 50-100 gauss location, the magnet's attractive forces are substantially reduced, thereby increasing operational safety while greatly reducing magnet complexity and cost, as well as magnetic shielding and siting costs.

The exemplary embodiments offer improvement in safety (force and torque reduction), cost savings (reduced or eliminated site shielding), lower cost coil and coil bobbin/former required (i.e., partially shielded design now feasible), and smaller magnet size (radius may decrease 5-15%, weight may decrease 5-10%).

Synergistic design of magnet and site shielding allows for these three improvements. Permissible magnet external field criteria may increase from 5 g to 50-100 g, thereby allowing for a design that significantly reduces magnet cost (10-25%) and size and simultaneously reduces external forces and torques.

It is also possible to minimize external forces and torques as a part of the coil design optimization process. It is additionally envisioned that attractive force and torque minimization can be inherently incorporated into the magnet design methodology, thus further reducing forces/torques while increasing operational safety. This presents a new method of coil design and optimization.

FIGS. 3A-3C and 4A-4C are for 1.5 T magnets. The FS coil depicted in these graphs is an actively shielded 1.5 T magnet with a 2.5 m radial×4.0 m axial 5 g specification. The PS (partially shielded) coil is also actively shielded 1.5 T magnet with a 3.0 m radial×5.0 m axial 5 g specification. The non-shielded magnet also depicted in the graphs contains no shielding.

The graphs show little difference in field v. axial distance near the magnet, but do show a reduced gradient and gradient of the energy product for the non-shielded magnet. It will have inherently less attractive forces in the region of interest.

The graphs also show that the field drops off much more gradually in the radial direction due to elimination of bucking coil windings. The gradient and gradient of the energy product are significantly less; thus this design has significantly less of the unwanted attractive forces in the region of interest.

An MRI installation's need for site shielding can be minimized or eliminated by using a synergistic design approach among the main winding, bucking winding and site shielding requirement to yield an overall optimized system.

Calculation and subsequent optimization of external fields, field gradients and gradient of the energy product could be added to the overall (main and bucking) coil design process. Using an optimization algorithm such as "Optimization by Simulated Annealing" or an alternative optimization routine, coil parameters can be optimized simultaneously. These coil parameters typically include central field, field legendre coefficients $Z2$, $Z4$, $Z6$, $Z8$, $Z10$, $Z12$, $Z14$, etc., radial and axial external fringe fields, coil total ampere-turns or ampere-meters, and the coil section internal peak fields and stresses. External fields, field gradients and gradient of the energy product could be added to the overall simultaneous optimization process.

The main and bucking electromagnet windings can be configured so as to create a net $B_m$ fringe field outside the magnet within the range of 50-100 g at a distance within a range of 3-5 meters axially and 2-3 meters radially from a center of the magnet.

At least one programmed data processor can be used to design a configuration for the main electromagnetic and bucking electromagnet winding to minimize magnetic field forces and torques acting on magnetically permeable objects located externally of the magnet within 3-5 meters axially and 2-3 meters radially from a center of the magnet.

Figure 5:
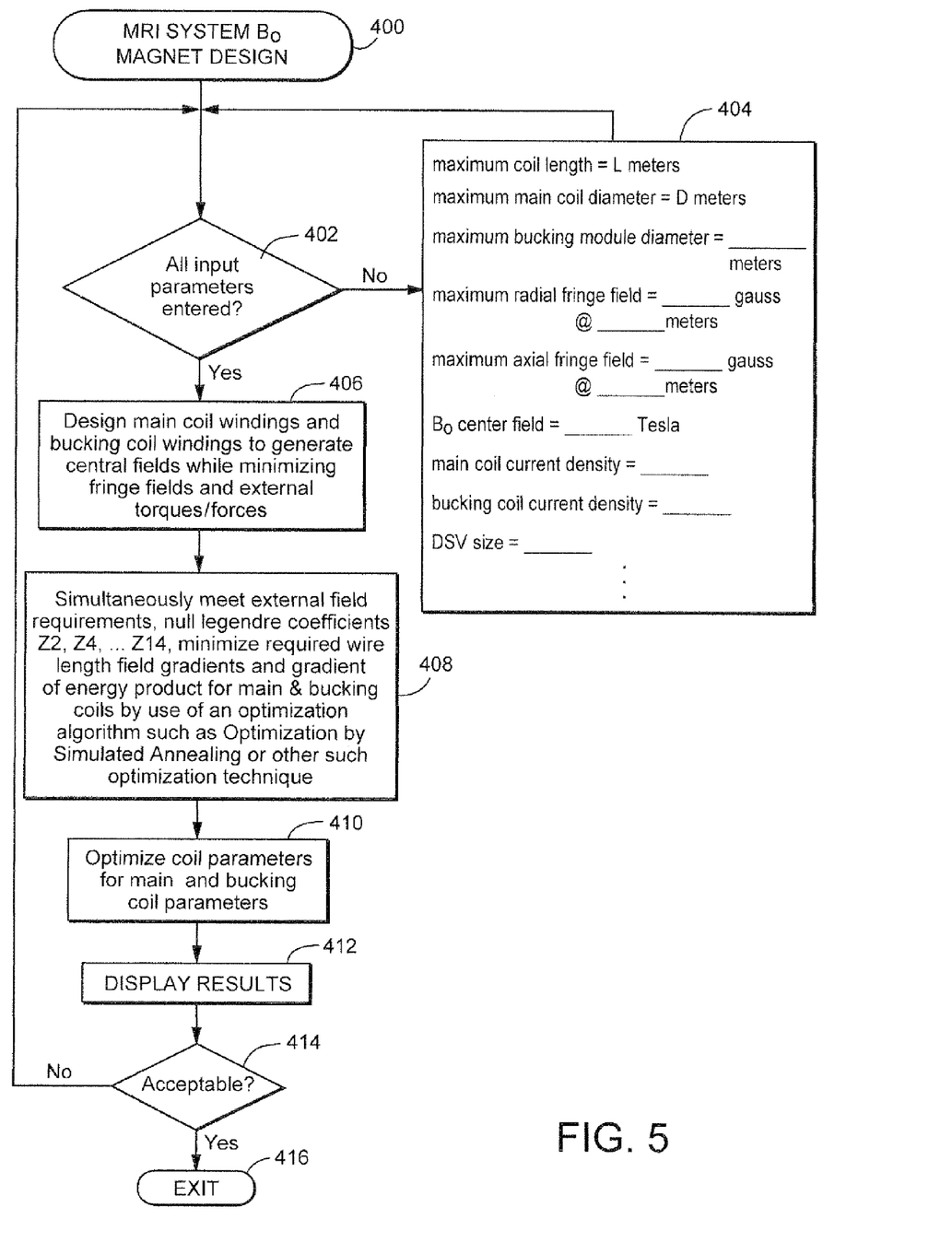
FIG. 5 is a schematic flow chart of exemplary computer program code structure that may be utilized for practicing an exemplary embodiment of a method for designing an improved magnetic resonance imaging system magnet.

FIG. 5 presents a schematic flow chart of exemplary computer programming code structure that may be entered as a sub-routine for MRI system $B_0$ magnet design at 400. A test is made at 402 to see if all input parameters have yet been entered. If not, then the operator is given an opportunity to enter the necessary input design parameters at 404. Eventually, when all input parameters have been entered, control is passed to block 406 in FIG. 5 where at least the bucking coil winding is designed so as to minimize fringe fields and torques. In the exemplary embodiment, the main coil windings and bucking coil windings are designed to generate desired central $B_0$ fields while minimizing $B_m$ fringe fields and external torques/forces. At block 408, simultaneous optimization is performed to meet external field requirements, null legendre coefficients Z2, Z4 . . . Z14, minimize required wire length, field gradients and gradient of energy products for the main and bucking coils by use of an optimization algorithm such as optimization by simulated annealing or other such optimization technique. At block 410, the coil parameters are optimized for the main and bucking coil parameters. The interim design results are then displayed at 412. If not yet found acceptable at 414, then control is passed back for input of a new set of design parameters at 402. If the interim results displayed at 412 are found to be acceptable, then this sub-routine is exited at 416 and control is passed back to the calling program or operating system.

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system magnet comprising:
   at least one main electromagnet winding disposed within a first radius of the magnet and configured to provide a magnetic field directed along an axial direction within the magnet and which also produces fringe magnetic fields outside said magnet;
   at least one bucking electromagnet winding disposed within a second radius, larger than said first radius, of the magnet and configured to provide self-shielding magnetic fields that substantially reduce fringe magnetic fields outside said magnet produced by said main electromagnet winding, the combination of magnetic fields produced by both the main and bucking electromagnet windings inside the magnet conforming to MRI requirements within at least an imaging volume;
   said main and bucking electromagnet windings being configured so as to create a net fringe field outside said magnet within the range of 50-100 gauss at a distance within a range of 3-5 meters axially and 2-3 meters radially from a center of the magnet.

2. An MRI system magnet as in claim 1, wherein said main and bucking electromagnet windings are configured to minimize the need for site shielding.

3. An MRI system magnet as in claim 2, wherein said main and bucking electromagnet windings and site shielding requirements are configured synergistically to yield an overall optimized MRI system.

4. An MRI system magnet as in claim 1, wherein the magnet is of cylindrical configuration having an axial z-dimension extending external to the magnet and along which $B_m$ static magnetic field is provided having strength, gradient and torque along the z-axis dimension within the hatched areas depicted in the graphs of FIGS. 3A-3C.

5. An MRI system magnet as in claim 1, wherein the magnet is of cylindrical configuration having an axial z-dimension extending external to the magnet and along which $B_m$ static magnet field is provided and having an orthogonal radial y-dimension also extending external to the magnet and along which the $B_m$ static magnet field exists having strength, gradient and torque along the y-axis dimension within the hatched areas depicted in the graphs of FIGS. 4A-4C.

6. An MRI system magnet as in claim 5, wherein $B_m$ static magnetic field is provided having strength, gradient and torque along the z-axis dimension within the hatched areas depicted in the graphs of FIGS. 3A-3C.

7. A process for designing a magnetic resonance imaging (MRI) system magnet having at least one main electromagnet winding disposed within a first radius of the magnet and configured to provide a magnetic field directed along an axial direction within the magnet and which also produces fringe magnetic fields outside said magnet and at least one bucking electromagnet winding disposed within a second radius, larger than said first radius, of the magnet and configured to provide self-shielding magnetic fields that substantially reduce fringe magnetic fields outside said magnet produced by said main electromagnet winding, the combination of magnetic fields produced by both the main and bucking electromagnet windings inside the magnet conforming to MRL requirements within at least an imaging volume, said process comprising:
   using at least one programmed data processor to design a configuration for at least said bucking electromagnet winding to minimize magnetic field forces and torques acting on magnetically permeable objects located externally of said magnet within 3-5 meters axially and 2-3 meters radially from a center of the magnet.

8. A process for designing an MRI system magnet as in claim 7, further comprising:
   calculating and subsequently minimizing external fields, field gradients and gradient of an energy product during design of a configuration for at least said main and bucking electromagnet windings.

9. A process for designing an MRI system magnet as in claim 7, further comprising:
   using an optimization algorithm to optimize coil parameters including central field, field legendre coefficients, radial and axial external fringe fields, coil total ampere-turns and internal peak fields and stresses for sections of said main and/or bucking coils while designing a configuration for at least said main and bucking electromagnet windings.

10. A process for designing an MRI system magnet as in claim 9, further comprising:
    calculating and subsequently minimizing external fields, field gradients and gradient of an energy product during design of a configuration for at least said main and bucking electromagnet windings.

11. A magnetic resonance imaging (MRI) system comprising:
    a static field magnet configured to generate a static magnetic field in an imaging region;
    a gradient coil set configured to generated gradient magnetic fields in said imaging region;
    at least one RF coil configured to transmit and/or receive nuclear magnetic resonance (NMR) RF signals to/from said imaging region; and an MR imaging unit configured to acquire and process MRI data based on said RF signals, wherein said static field magnet comprises at least one main electromagnet winding disposed within a first radius of the magnet and configured to provide a magnetic field directed along an axial direction within the magnet and which also produces fringe magnetic fields outside said magnet;

at least one bucking electromagnet winding disposed within a second radius, larger than said first radius, of the magnet and configured to provide self-shielding magnetic fields that substantially reduce fringe magnetic fields outside said magnet produced by said main electromagnet winding, the combination of magnetic fields produced by both the main and bucking electromagnet windings inside the magnet conforming to MRI requirements within at least an imaging volume;

said main and bucking electromagnet windings being configured so as to create a net fringe field outside said magnet within the range of 50-100 gauss at a distance within a range of 3-5 meters axially and 2-3 meters radially from a center of the magnet.

12. An MRI system as in claim 11, wherein said main and bucking electromagnet windings are configured to minimize the need for site shielding.

13. An MRI system as in claim 12, wherein said main and bucking electromagnet windings and site shielding requirements are configured synergistically to yield an overall optimized MRI system.

14. An MRI system as in claim 11, wherein the magnet is of cylindrical configuration having an axial z-dimension extending external to the magnet and along which $B_m$ static magnetic field is provided having strength, gradient and torque along the z-axis dimension within the hatched areas depicted in the graphs of FIGS. 3A-3C.

15. An MRI system as in claim 11, wherein the magnet is of cylindrical configuration having an axial z-dimension extending external to the magnet and along which $B_m$ static magnet field is provided and having an orthogonal radial y-dimension also extending external to the magnet and along which the $B_m$ static magnet field exists having strength, gradient and torque along the y-axis dimension within the hatched areas depicted in the graphs of FIGS. 4A-4C.

16. An MRI system as in claim 15, wherein $B_m$ static magnetic field is provided having strength, gradient and torque along the z-axis dimension within the hatched areas depicted in the graphs of FIGS. 3A-3C.

* * * * *